United States Patent
Verkhovskiy

[11] Patent Number: 6,075,448
[45] Date of Patent: Jun. 13, 2000

[54] APPARATUS AND METHOD FOR TESTING AN ELECTRICAL CIRCUIT

[76] Inventor: Yan Verkhovskiy, 1717 E. Eighth St., Apt. 1R, Brooklyn, N.Y. 11223

[21] Appl. No.: 09/082,903

[22] Filed: May 21, 1998

[51] Int. Cl.[7] .................................................. G08B 21/00
[52] U.S. Cl. .......................... 340/657; 340/660; 340/661; 340/664; 324/133; 324/555; 324/556
[58] Field of Search ....................... 340/657, 635, 340/650, 660, 661, 664; 324/500, 524, 525, 133, 555, 556; 361/90

[56] References Cited

U.S. PATENT DOCUMENTS

| | | | |
|---|---|---|---|
| 4,205,264 | 5/1980 | Gold | 324/51 |
| 4,210,862 | 7/1980 | Koslar | 324/51 |
| 4,225,817 | 9/1980 | Kahlden | 324/133 |
| 4,366,434 | 12/1982 | Ellis | 324/556 |
| 4,825,150 | 4/1989 | Sirasud | 324/133 |
| 4,859,932 | 8/1989 | Whitley | 324/72.5 |
| 5,481,185 | 1/1996 | Lane et al. | 324/556 |

OTHER PUBLICATIONS

Kosow, "Overvoltage and Undervoltage Protection," *Electric Machinery and Control*, 1964, pp. 480–481.

*Primary Examiner*—Julie Lieu
*Attorney, Agent, or Firm*—Biebel & French

[57] ABSTRACT

This invention solves the problem of differentiating between a short-circuit and a low resistance value. A multi-tester impresses voltage across an LED circuit in inverse correspondence with the resistance of a subject circuit. A low-resistance voltage divider, including a circuit under test having an unknown resistance $R_X$ as a first shoulder or voltage portion, causes a threshold voltage to be impressed across the LED, thereby causing the LED to emit light for circuit resistance values at or below a maximum detectable resistance $R_{X1}$. Shorts are detected by switching a shunt resister defining a second shoulder or voltage portion into parallel relationship with the LED circuit. The shunt resister has a low resistance which decreases the sensitivity of the LED to such a point that the threshold voltage is impressed across the LED for a circuit resistance $R_{X2}$ of near zero amount. When the shunt resister is switched into operation, the LED emits light if, and only if, there is a short in the subject circuit. In another embodiment, the multi-tester impresses a voltage across an LED circuit in correspondence with the resistance of a subject circuit. The LED circuit is connected in parallel with a battery. The subject electrical circuit having an unknown resistance $R_X$ shunts the LED circuit. For values of $R_X$ below a minimum amount, the LED does not emit light. For values of $R_X$ up to about a maximum detectable resistance, the LED emits light of greater intensity.

11 Claims, 4 Drawing Sheets

APPARATUS AND METHOD FOR TESTING AN ELECTRICAL CIRCUIT

BACKGROUND OF THE INVENTION

This invention relates to electrical circuit testing and more particularly to AC/DC circuit testing at construction and maintenance sites where rugged testing equipment is required. Still more particularly the invention relates to apparatus and method for conveniently detecting circuit shorts, establishing continuity, indicating resistance throughout a plurality of ranges, measuring voltage and detecting voltage polarity.

It is well known to provide electrical testing apparatus which measures and indicates voltage, indicates polarity, and checks circuit continuity. In most cases, electrical faults can be detected by using a tester that measures the expected value of voltage and checks the continuity of a circuit under test. However, it is often necessary to be able to distinguish between short-circuits and circuits having low resistance values. For example, motor windings, relay coils, and transformer windings typically have low resistance values. It is of critical importance to be able to determine whether these devices are short-circuited before applying power to them.

However, typical continuity testers will not differentiate between a circuit having a low resistance value, such as 100 ohms to 10,000 ohms, and a circuit with a short measuring about ten ohms or less. A typical tester of such a type is disclosed in Sirasud U.S. Pat. No. 4,825,150. It is an object of this invention to provide a tester having all the capabilities of such prior art devices, as well as continuity testing capable of distinguishing between short-circuit conditions and low-resistance conditions, and providing a discernible indication of such conditions.

SUMMARY OF THE INVENTION

This invention includes a novel continuity tester able to distinguish between a short-circuit condition and a low-resistance value.

A first novel feature of this invention is a short-circuit detection circuit having a low-resistance voltage divider. The voltage divider has two voltage portions or shoulders wherein a first shoulder comprises a circuit under test and a second shoulder comprises a comparatively low resistance value such as, for example, about 20 ohms. An LED circuit is connected in parallel to the second shoulder when a pushbutton switch is momentarily closed. The resistance of the second shoulder is chosen so that the resistance of the LED circuit is about thirty times that of the resistance of the second shoulder, so that the resistance of the second shoulder dominates and the resistance of the LED circuit may be effectively ignored. The LED will turn on only when the voltage across it exceeds a threshold value such as, for example, about two volts. For a battery input of three volts, the voltage across the LED circuit will be about two volts or more when the resistance of the circuit under test is about ten ohms or less. When the resistance of the circuit under test is greater than about ten ohms, then the voltage developed across the second shoulder is less than the threshold value and the LED is turned off. Unknown resistances of about ten ohms or less are thereby detected.

A second novel feature of the invention is a circuit for distinguishing between resistances of from about 100 ohms to about 1000 ohms. An LED circuit is shunted by a circuit under test and a known voltage is applied to the parallel combination. If the resistance of the circuit under test is about 1000 ohms or more, then the brightness of the LED is maximum. If the resistance of the circuit under test is about 100 ohms or less, then the LED is unlit. The intensity of the light output from the LED varies from maximum to minimum as the resistance of the circuit under test varies from about 1000 ohms to about 100 ohms.

A third novel feature of the invention is a circuit for providing direct connection of a short-circuit detection circuit to a pair of input prods only when no voltage (i.e., less than about 2.5 V) is present across the input prods. A relay responsive to voltage-detection means connects the circuit under test directly to the short-circuit detection circuit. When an impedance of about 350 k$\Omega$ or less is connected across a pair of test prods, the means for detecting energizes a yellow continuity-indicating LED and a relay coil. This in turn causes a normally open relay contact to close thereby connecting a bypass line to place the circuit under test in series with a battery, a green LED, and a series limiting resistor. The brightness of the green LED is inversely proportional to the resistance of the circuit under test. In the event the voltage across the input prods exceeds about 2.5 volts, the voltage-detection means includes a transistor that turns on, that in turn deenergizes the relay, thereby opening the relay contact and disconnecting the short-circuit detection circuit.

A fourth novel feature of the invention includes apparatus and method for reducing the size of a voltage tester by providing a neon lamp with an adjustable voltage divider to provide the capability of measuring voltage in the range of from about 50 volts to about 500 volts. A knob having graduated voltage markings associated with it permits an operator to change the voltage threshold necessary to turn on the neon lamp. When the lamp turns on, the operator can read off the voltage of an applied voltage under test from the graduated markings.

Other objects and advantages of the invention will be apparent from the following description, the accompanying drawings and the appended claims.

DESCRIPTION OF THE PREFERRED EMBODIMENT

Figure 1:
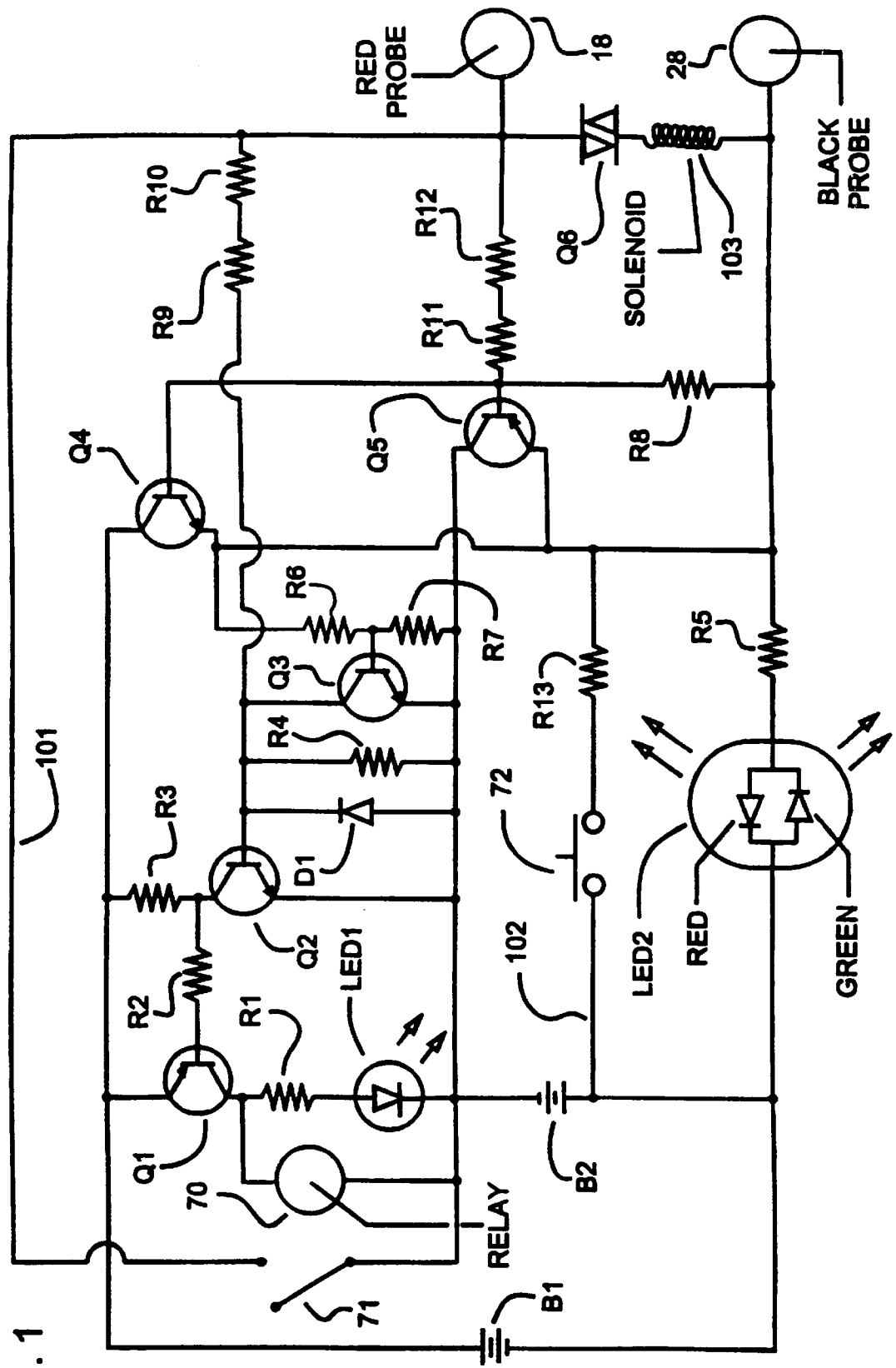
FIG. 1 is a schematic diagram of the testing apparatus in a first embodiment.

FIG. 1 illustrates a first embodiment of the present invention. Comparing that figure with FIG. 1 of the Sirasud patent, numerous points of similarity will be observed, including general layout, resistance values and many common reference numerals. Reference may be made to that patent for particularities on elements of commonality. Preferred values for components shown in FIG. 1 are listed in Table I.

TABLE I

| Ref. No. | Resistance |
|---|---|
| Resistors | |
| R1 | 1 KΩ |
| R2 | 220 KΩ |
| R3 | 220 KΩ |
| R4 | 820 KΩ |
| R5 | 100 Ω |
| R6 | 820 KΩ |
| R7 | 470 KΩ |
| R8 | 470 KΩ |
| R9 | 220 KΩ |
| R10 | 220 KΩ |
| R11 | 220 KΩ |
| R12 | 220 KΩ |
| R13 | 20 Ω |
| Batteries | |
| B1 | 3 V |
| B2 | 3 V |

Referring now to FIG. 1, the circuit of this embodiment has a RED probe 18 and a BLACK probe 28 for connection to a circuit (not illustrated) being tested. A voltage indicator mechanism comprising a solenoid 103 is connected in series with a bilateral silicon switch Q6 and connected between probes 18, 28. The voltage indicator is conventional and is not illustrated herein. Very generally, it has a spring which is opposed by solenoid 103 when Q6 is conductive. This happens when the potential across Q6 is greater than a first predetermined value, typically about eight volts. Under these conditions, Q6 presents a very low resistance, and the voltage across probes 18, 20 appears across the solenoid. This moves the solenoid and stretches the spring, thereby causing movement of a mechanical indicator. However, no voltage readings are indicated until the voltage across the probes reaches a second predetermined value, which may range from about 80 to 90 volts.

Voltage polarity is indicated by parallel RED and GREEN light emitting diodes incorporated within LED2. Resistors R11, R12 form a voltage divider with R8 that places about 54% of the probe voltage across the base-to-emitter junctions of transistors Q4, Q5. If probe 18 is positive relative to probe 28, and the difference is at least about 2.5 volts, Q4 turns ON and completes a circuit through battery B1, the RED branch of LED2 and R5. This produces red light to signal the positive polarity. Similarly, a negative 2.5 volts at the probes completes a circuit through transistor Q5, battery B2, the GREEN branch of LED2 and R5, and generates a green signal. Again this is known in the prior art.

As is also known in the prior art, continuity testing is provided by transistors Q1, Q2, Q3 and LED1, a preferably YELLOW light emitting diode. Transistor Q2 is normally biased OFF by R4. Battery B2 normally provides a weak positive voltage to the base of Q2. A voltage divider comprising R5, R8, R11, R12, R9, R10 and R4 normally puts a positive potential of about 0.57 volts across the base-to-emitter junction of Q2. This is insufficient to turn on Q2. However, if a good conductor is placed across probes 18, 28, then resistors R8, R11, R12 are effectively shorted out. This turns on Q2, thereby also turning on Q1 and causing a curent flow through LED1. A "good" conductor in this context is a conductor having a resistance less than about 350 kΩ. LED1 will emit a yellow light to indicate continuity of a circuit being tested, so long as the resistance across probes 18, 28 is less than 350 kΩ, provided, however, that the potential across the probes remains less than about 2.5 volts. Any higher voltage across the probes will turn on Q3, which in turn will switch off Q2, Q1 and LED1. A diode D1 is provided for protecting Q2 against negative transients.

Relay 70, a novel feature of FIG. 1, controls a normally open relay contact 71. Relay 70 is placed in parallel with resistor R1 and LED1. When Q1 becomes conducting and begins supplying an operating current to LED1, it also activates relay 70. That in turn closes contact 71 and connects the cathode of battery B2 directly to RED probe 18 via bypass line 101. That creates a closed loop through battery B2, the GREEN side of LED2, resistor R5, BLACK probe 28, the outside circuit under test, RED probe 18, bypass line 101 and contact 71. This causes LED2 to emit GREEN light having an illumination level that inversely indicates the resistance of the outside circuit. A short causes maximum emission by the LED, but that is not easily recognized with the test circuitry as thus far described. Thus the invention provides a normally open shunting switch 72 and a shunting resistor R13.

Figure 2:
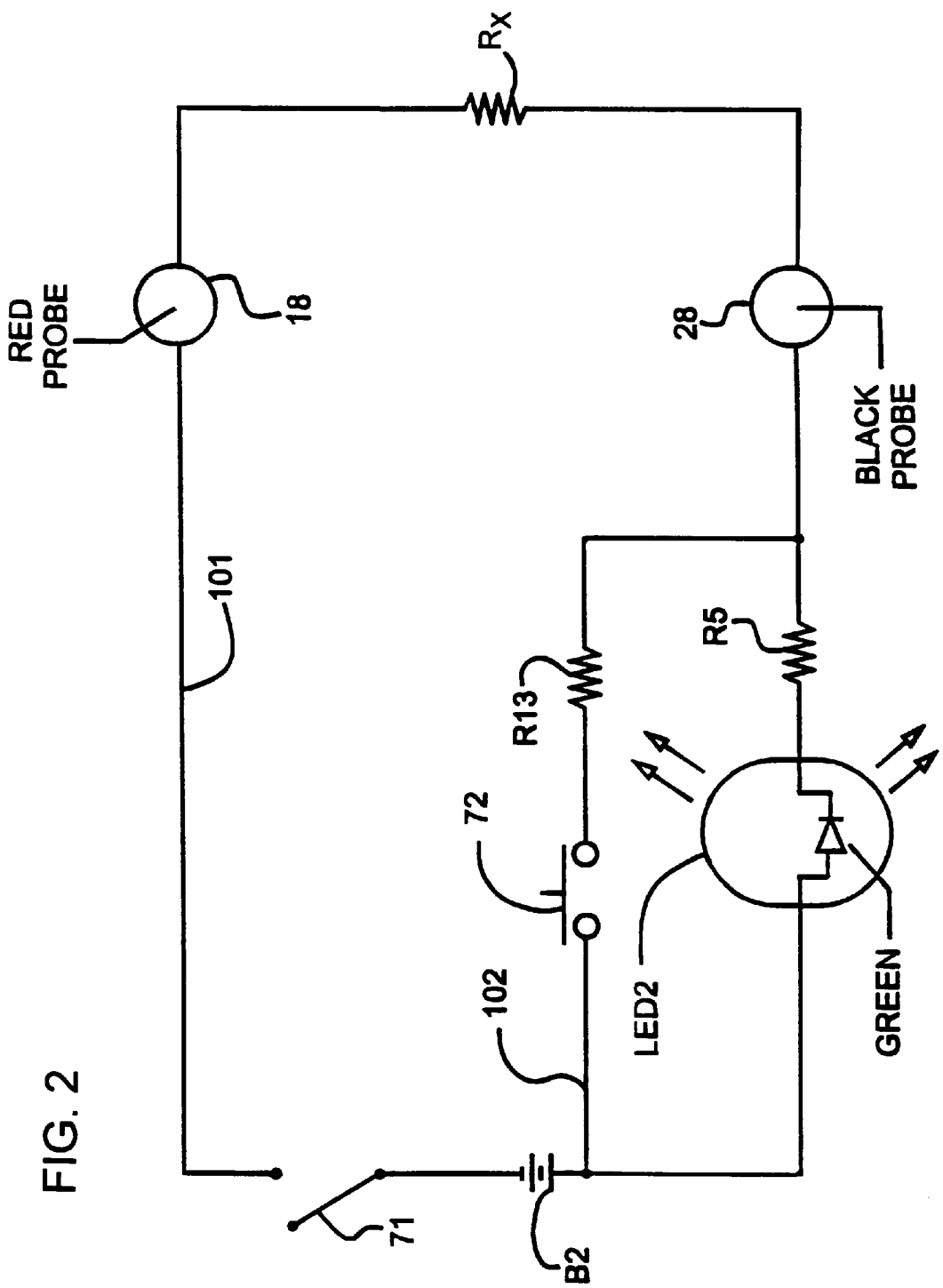
FIG. 2 is a simplified schematic diagram of test circuitry in accordance with the invention.

Referring to FIG. 2, the operation of the short-circuit detection circuitry will be described in detail. Provided that the voltage across the probes 18, 28 is less than about plus or minus 2.5 volts, and the resistance of the circuit under test $R_X$ is about 350 kΩ or less, then relay contact 71 is closed, thereby placing the circuit under test in series with battery B2, LED2, and resistor R5.

As the value of $R_X$ is varied from a maximum detectable value $R_{X1}$ (which is about 20 kΩ in this embodiment with the values shown), to a minimum value, the GREEN LED will vary inversely in brightness from its dimmest level to its brightest level. The illumination intensity level of LED2 thereby gives an indication of the relative value of the unknown resistance $R_X$. Series resistor R5 acts to protect LED2 by limiting the maximum current through LED2 when $R_X$ is about zero or when the test prods 18, 28 are shorted together.

In order to distinguish between a short circuit and a low resistance value, normally open pushbutton switch 72 is closed, thereby connecting shunting resistor R13 in parallel with LED2 and series resistor R5. The value of R13 is chosen such that when an unknown resistance $R_X$ has a maximum value $R_{X2}$ ($R_{X2} < R_{X1}$), then the voltage drop across LED2 is equal to the forward threshold voltage $V_T$ of LED2. As the value of the unknown resistance $R_X$ becomes progressively smaller than $R_{X2}$, LED2 becomes progressively brighter. For values of $R_X$ greater than $R_{X2}$, LED2 is dark. Thus, it is possible to detect a short circuit wherein a short circuit is defined as being a resistance value of $R_{X2}$ or less.

For the component values shown in FIG. 2, the maximum detectable resistance value is about 20 kΩ. If it is desired to define a short circuit as being about ten ohms or less (i.e., $R_{X2}=10$ Ω), then it is necessary to choose a value for R13 that will develop a voltage of two volts or more across LED2 when $R_X$ is ten ohms or less. For small values of R13, with respect to the combined value of the LED2 forward resistance and series resistance R5 (R13 << $R_{LED2}$+R5), then the tester may be viewed as a voltage divider with the unknown resistance $R_X$ forming a first shoulder, and the shunting resistor R13 forming a second shoulder. It may then be seen that for $R_X$ equal to ten ohms, two volts will be developed across R13 when R13 is about 20 ohms. More precise calculations, taking into account the presence of LED2 and R5, reveal that for a value of 20 ohms for R13, LED2 will turn on when $R_X$ is equal to or less than about 9.94 ohms.

The detectable short circuit resistance value $R_{X2}$ may be varied from about zero ohms to about 100 ohms by choosing appropriate values for R13. For example, a value of 200 ohms for R13 will permit detection of resistance values of about 100 ohms and less.

Figure 3:
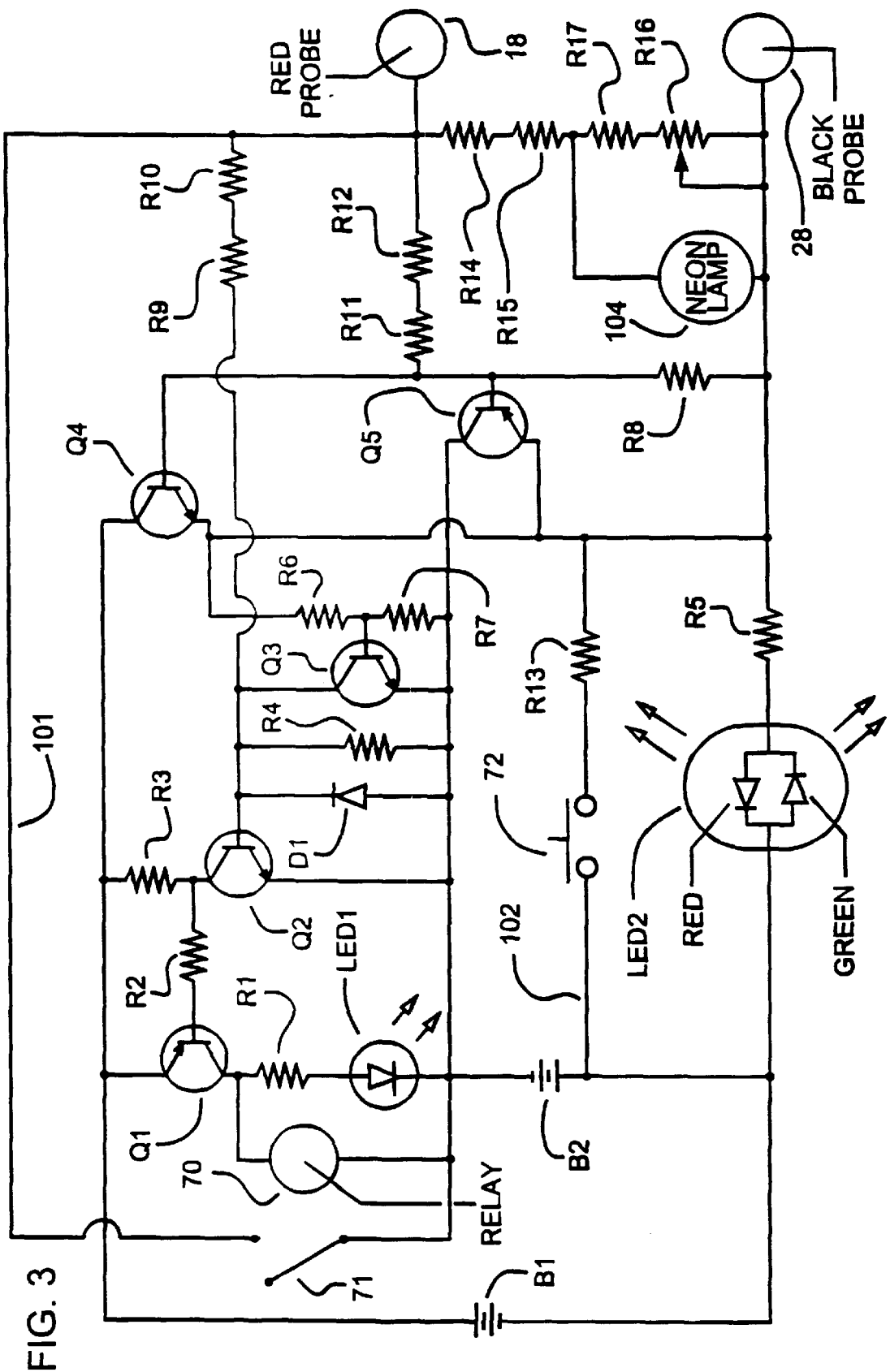
FIG. 3 is a schematic diagram of the testing apparatus in a second embodiment.

As illustrated in FIG. 3, a second embodiment of the invention uses a neon lamp indicator and an adjustable voltage divider in place of the solenoid type voltage indicator. This allows the size of the apparatus to be reduced. In addition, in this embodiment, one of the probes is integrated into the housing of the tester. The second embodiment employs a neon lamp 104 in parallel with an adjustable resistor R16 and a resistor R17. The resistor R16 may have a full-scale resistance of about 1 megohm and the resistor R17 may have a resistance of about 100 kΩ.

Neon lamp 104 and resistors R16, R17 are in series with a pair of resistors R14, R15 which may have resistances of about 500 kΩ each. Voltage is measured by adjusting R16 until the illumination threshold of neon lamp 104 is reached. The resistor R17 allows the neon lamp 104 to provide a voltage indication when the resistor R16 is fully shorted. The adjustment control carries a pointer on the resistor R16 which moves across a faceplate having markings which are scaled to read in volts. The markings may be arranged in either a circular or a linear configuration.

Other components of the alternative embodiment are identical to components illustrated in FIG. 1 and have identical functions. They include relay 70, which may be a type SE061A20 miniature, high voltage, reed relay. This relay has a rated coil voltage of 5–6 VDC, a coil resistance of 125 ohms and a contact rating of 1000 VDC. Transistor Q1 must be able to carry a current of 0.020 amps for LED1 plus 0.048 amps for the relay coil.

Figure 4:
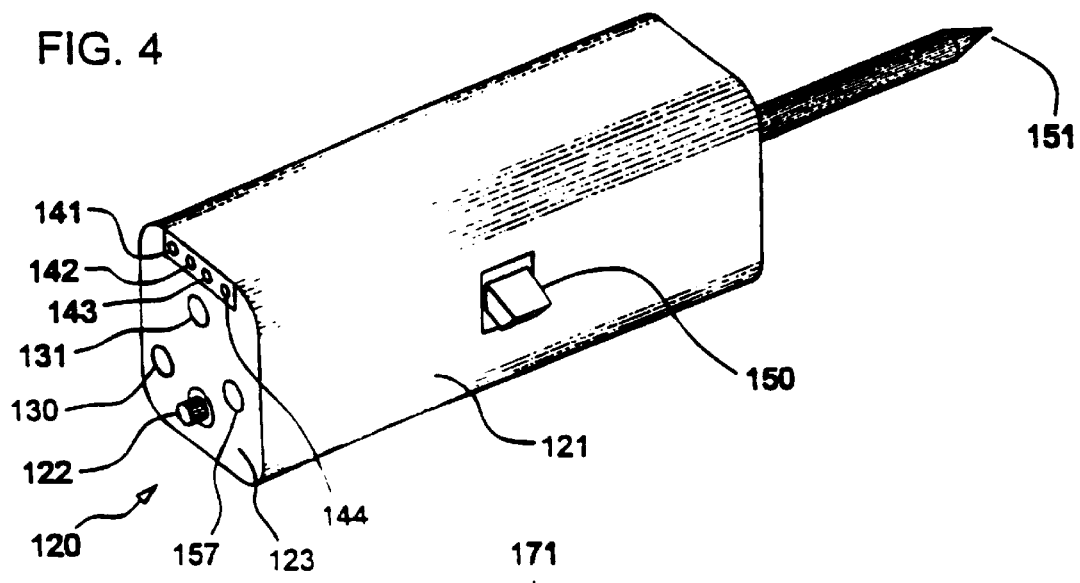
FIG. 4 is a perspective drawing of a tester equipped with test circuitry configured in accordance with a third embodiment of the invention.

FIG. 4 illustrates a tester 120 which incorporates the invention in a third embodiment. Tester 120 has a case 121 mounted fast to a fixed probe 151 configured for contacting a suitable point on an external circuit. A set of four terminals 141–144 are mounted on a rear panel 123 for selective connection to a flexible lead line for a second probe (not illustrated). Case 121 supports probe 151 during use. In operation, a technician holds case 121 in one hand and the flexibly supported probe in another. A third hand is not required, as is so often the situation with conventional testers.

Tester 120 also has a toggle switch 150 mounted on the side of housing 121 and a pushbutton switch 122 mounted on a rear panel 123. Switch 122 functions similarly to switch 72 of the first-described embodiment. Switch 122 is a normally open switch and is easily depressed by a thumb while holding case 121. There are also a RED LED 131, a RED/GREEN polarity LED 130, and a neon lamp 157, all mounted on rear panel 123 for easy observation. Electrical connections for these items are illustrated in the schematic diagram appearing in FIG. 5. Preferred resistance values are listed in Table II.

TABLE II

| Ref. No. | Resistance |
| --- | --- |
| 162 | 500 Ω |
| 163 | 2 KΩ, 0.5 w |
| 164 | 1 MΩ |
| 175 | 500 Ω |
| 173 | 20 Ω, 0.5 w |

Figure 5:
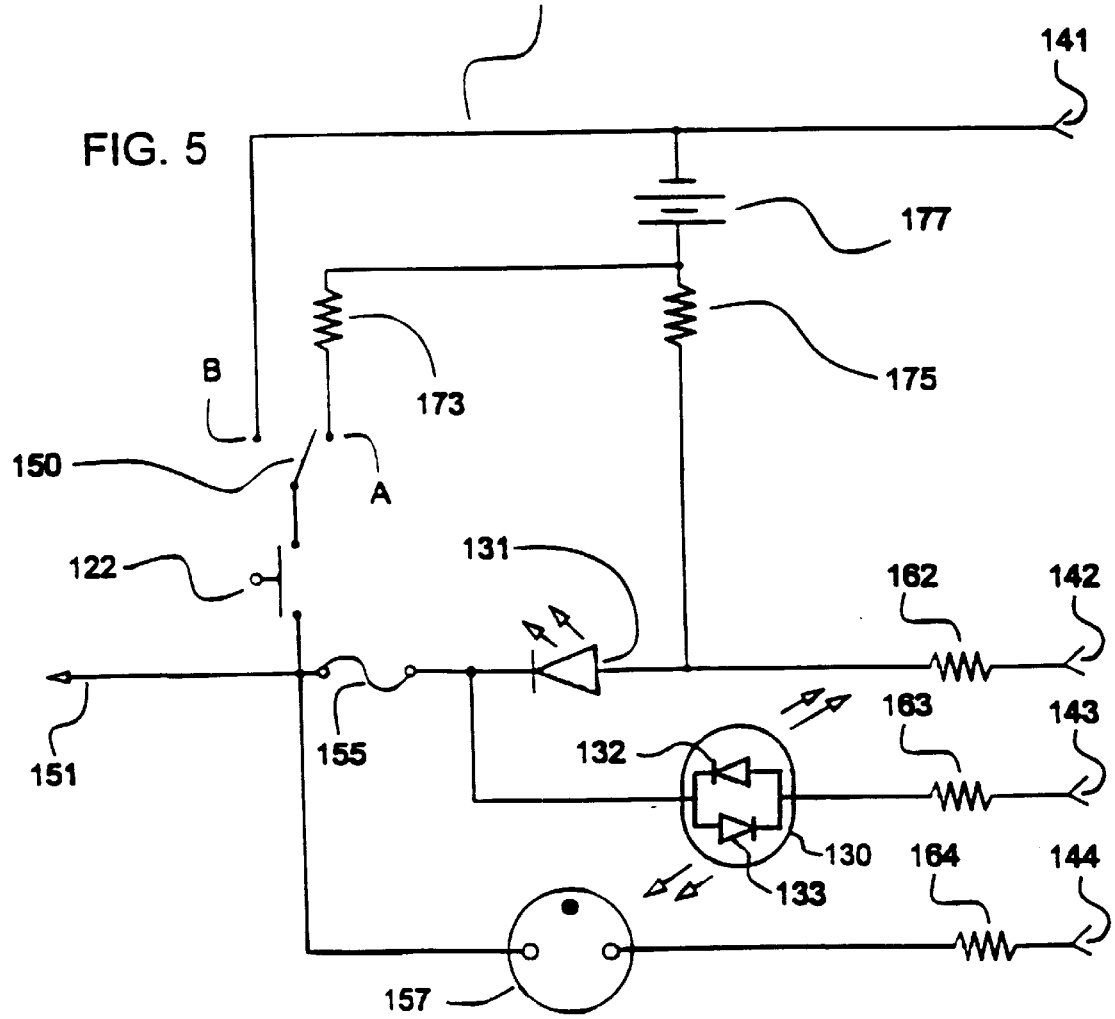
FIG. 5 is a schematic drawing of test circuitry in accordance with the third embodiment of the invention.

Turning now to the circuit shown in FIG. 5, neon lamp 157 indicates voltage, LEDs 132, 133 indicate polarity and LED 131 is selectively switched to indicate either resistance/ continuity or existence of a short. Fuse 155 protects the LEDs 131, 132, 133 from excessive currents and may be sized to open before the maximum safe current for the LEDs is exceeded. The operation of neon lamp 157 and its resistor 164 is self-evident and need not be described in detail. When an external circuit is connected between terminal 144 and probe 151, neon lamp 157 indicates higher voltages in a range between 50 and 500 volts.

Lower voltages in a range between 5 and 50 volts are measured by connecting the external circuit between terminal 143 and probe 151. That passes current through resistor 163 and a polarity LED 130, and illuminates either or both of halves 132, 133 of the polarity LED 130, depending upon whether DC or AC voltage is being sensed. Voltage polarity is determined by noting which half of the polarity LED is being illuminated. The voltage level is estimated by observing the brightness of the light emission.

LED 131 performs three different functions. First, it indicates resistance in a range between about 100 and 1000 ohms by changing emission brightness. For this indication, the external circuit having an unknown resistance is connected to terminal 142 and probe 151, switch 150 being in position B and switch 122 being momentarily pushed. This places LED 131 in parallel with the series combination of resistor 162 and the unknown resistance. At the same time, LED 131 is placed in series with battery 177 via resistor 175, line 171, switch 150 and switch 122. The resistance of the circuit under test shunts the LED circuit. When the resistance of the circuit under test is less than about 1000 ohms, then the brightness of the LED 131 diminishes. When the resistance of the circuit under test is about 100 ohms or less, then the LED 131 will not be lit. The LED 131 will exhibit maximum brightness when the resistance of the circuit under test is about 1000 ohms or greater.

Secondly, LED 131 checks continuity by emitting light at a level inversely related to circuit resistance in a range preferably between about 0 and 20 kΩ. This is done with switch 150 in position A, switch 122 open and the external circuit connected to terminal 141 and probe 151. In this arrangement, the LED 131 is in series with resistor 175 and battery 177, and the circuit under test.

This invention in the embodiment of FIG. 5 solves the problem of differentiating between a short-circuit and a low resistance value by providing a shunting resistor 173 (activatable when switch 150 is in position A) to give LED 131 its third operating function. That function will now be described.

Referring again to FIG. 5, consider the situation when the external circuit is connected between terminal 141 and probe 151 and switch 150 is in position A. When switch 122 is momentarily closed, shunting resistor 173 is put in parallel with the series combination of LED 131 and resistor 175. The circuit under test, having unknown resistance $R_X$, and the resistor 173 form a voltage divider with the circuit under test forming a first shoulder of the divider and the shunting resistor 173 forming a second shoulder of the voltage divider.

In order to detect a short, the shunt resistor 173 is selected so as to cause the voltage across the LED 131 to take on the turn-on threshold value $V_T$ when the unknown resistance of the circuit under test, $R_X$, has a value $R_{X2}$, the maximum value of $R_X$ which will be deemed a short. In the embodiment shown in FIG. 5, battery 177 supplies 3V, resistor 175 has a resistance of 500 Ω, and the LED 131 has a forward threshold voltage $V_T$ of about 2 V.

Using 9.7 ohms as a preferred value of $R_{X2}$, we find a preferred value for the shunting resistor 173 as being about 20 ohms. Given such a value, the tester is able to cause a visible emission from LED 131 only when the resistance of the external circuit is at or below 9.7 ohms, which may be considered to represent a short.

While the above example uses a resistance value of 9.7 ohms as representing the upper limit of a short, other numbers could be used. In general $R_{X2}$ may have any value in a range between about 0 and 100 ohms. Appropriate values for the shunting resistor 173 may then be chosen so as to yield a voltage across the LED 131 greater than the threshold voltage only when the value of the unknown resistance $R_X$ is at or below the maximum short detection resistance value $R_{X2}$. For example, for a value for $R_{X2}$ of about 96.7 ohms, a shunting resistor having a value of about 200 ohms may be used. For a value for $R_{X2}$ of about 4.85 ohms, a shunting resistor having a value of about ten ohms may be used.

It should also be realized that other circuit parameters may be varied as desired.

While the methods herein described, and the forms of apparatus for carrying these methods into effect constitute preferred embodiments of this invention, it is to be understood that the invention is not limited to these precise methods and forms of apparatus, and that changes may be made in either without departing from the scope of the invention, which is defined below in the appended claims.

What is claimed is:

1. Apparatus for testing an electrical circuit comprising:
   (a) terminal means for connection to said circuit,
   (b) a voltage indicator connected to said terminal means for sensing voltage values across said circuit and providing indications thereof,
   (c) a light emitting diode for indicating polarities of said voltage values,
   (d) polarity drive means for causing polarity indications by said light emitting diode, and
   (e) bypass means comprising a bypass line connected between said light emitting diode and said terminal means, and a normally-open relay positioned within said bypass line, said relay being connected for closure in response to current flow conditions occurring when voltage values across said circuit are below a predetermined amount so that said light emitting diode is connected to enable variation of light emission by said light emitting diode in a manner inversely indicating resistance values across said circuit.

2. Apparatus according to claim 1 further comprising:
   (f) a shunting resistor for creating a shunt around said light emitting diode, and
   (g) a shunting switch for momentarily connecting said shunt, so that said light emitting diode provides an indication from which the presence of a short in said circuit may be determined.

3. Method of indicating an unknown resistance of a subject electrical circuit, comprising the steps of:
   (1) connecting a series resistance to said subject electrical circuit,
   (2) connecting a light emitter to said series resistance,
   (3) connecting a voltage source to said subject electrical circuit, said series resistance and said light emitter so that a voltage is impressed across said electrical circuit, said series resistance and said light emitter for causing emission of observable light at a level inversely corresponding to said unknown resistance, and
   (4) testing for a short in said subject circuit by connecting a shunting resistance in parallel with said series resistance and said light emitter, said electrical circuit forming a first shoulder of a voltage divider, said shunting resistance forming a second shoulder of said voltage divider, said impressed voltage being divided into a first voltage portion impressed across said first shoulder and a second voltage portion impressed across said second shoulder, said light emitter emitting observable light only in the event of substantially no resistance in said subject circuit.

4. Testing apparatus for a subject electrical circuit comprising:
   (a) a light emitting circuit including a light emitter that is electrically conductive and which emits visible light in response to a voltage having a level in excess of a known threshold, said light emitter being non-responsive to voltage having a level below said threshold,
   (b) first terminal means for connecting said subject circuit to said light emitting circuit,
   (c) a power source for supplying voltage to said first terminal means and said light emitting circuit, and
   (d) shunting resistance means momentarily connectable in parallel with said light emitting circuit;
   said light emitting circuit having a forward resistance such that said power source causes said light emitter to have a voltage thereacross having a level equal to said threshold when there is placed between said first terminal means a resistance of an amount that is a first predefined maximum resistance to be recognized, $R_{X1}$; and
   said shunting resistance means having a shunting resistance such that said power source causes said light emitter to have a voltage thereacross having a level equal to said threshold when said shunting resistance means is connected in parallel with said light emitting circuit and there is placed between said first terminal means a resistance of an amount that is a predefined maximum resistance to be recognized as a short, $R_{X2}$, where $R_{X2}$ is less than $R_{X1}$.

5. Apparatus according to claim 4 further comprising a housing for said light emitting circuit, said shunting resistance means and said power source, and a relatively inflexible probe, supportably fixed to said housing and connected for communication with said power source, said light emitting circuit, and said shunting resistance means.

6. Apparatus according to claim 5, said housing being provided with a rear panel opposite said relatively inflexible probe, said light emitter being mounted on said rear panel.

7. Apparatus according to claim 4 further comprising
   (f) connection means for connecting said power source in parallel with said light emitting circuit;
   (g) series resistance means connected to said light emitter; and
   (h) second terminal means connected to said series resistance means for connecting said subject electrical circuit and said series resistance means in parallel with said light emitter;
   said series resistance means having a series resistance such that said power source causes said light emitter to have a voltage thereacross having a level equal to said threshold when there is placed between said second terminal means a resistance of an amount that is a predefined minimum resistance to be recognized, $R_{X3}$; and
   said light emitter emits light having a maximum observable brightness when there is placed between said second terminal means a resistance of an amount that is a second predefined maximum resistance to be recognized, $R_{X4}$, where $R_{X4}$ is greater than $R_{X3}$.

8. Apparatus according to claim 4 further comprising:

(j) polarity indicating means, and (k) third terminal means for connecting said subject electrical circuit to said polarity indicating means;

said polarity indicating means providing a first polarity indication when said subject electrical circuit provides a voltage having a first polarity and a level not exceeding a first predetermined maximum voltage, $V_{X1}$, and a second polarity indication when said subject electrical circuit provides a voltage having a second polarity and a level not exceeding said predetermined maximum voltage, $V_{X1}$.

9. Apparatus according to claim 8 wherein said polarity indicating means includes a first light emitting diode connected in parallel with a second light emitting diode, said diodes connected so that no more than one of said diodes is conducting at any given time.

10. Apparatus according to claim 4 further comprising:

(m) a neon lamp circuit, including a neon lamp; and (n) fourth terminal means for connecting said neon lamp circuit to said subject electrical circuit;

said neon lamp circuit having a neon lamp circuit resistance such that said neon lamp emits visible light when said subject electrical circuit provides a voltage having an absolute value of from about a predefined minimum voltage level $V_{XMIN}$ to about a predefined maximum voltage level $V_{XMAX}$.

11. Apparatus for testing an electrical circuit of the general type for measuring a test voltage or detecting the relative continuity or indicating the relative resistance between first and second test points, and including first and second inputs to which said first and second test points can be respectively electrically connected; a continuity circuit, a polarity circuit, and a voltage amplitude circuit continuously and simultaneously connected electrically to said first and second inputs; and power source means electrically connected to said continuity and polarity circuits for powering them; the improvement comprising:

a switching circuit and a short-circuit detection circuit, said switching circuit including sensing means and switching means, said sensing means activating said switching means to electrically connect said first and second inputs directly to said short-circuit detection circuit whenever a passive impedance having less than a first predetermined impedance value is electrically connected between said first and second inputs;

said short-circuit detection circuit including a resistance indicator in series electrical connection with said power source means, and a shunting impedance means momentarily electrically connectable in parallel with said resistance indicator;

said power source means activating said series resistance indicator whenever said shunting impedance is electrically disconnected from said resistance indicator and said passive impedance has a value below a second predetermined impedance value; and said power source means activating said series resistance indicator whenever said shunting impedance is electrically connected to said resistance indicator and said passive impedance has a value below a third predetermined impedance value defined to represent a short-circuit condition.

\* \* \* \* \*